(12) United States Patent
Suen et al.

(10) Patent No.: US 11,873,212 B2
(45) Date of Patent: Jan. 16, 2024

(54) CHIP PACKAGE AND MANUFACTURING METHOD THEREOF

(71) Applicant: XINTEC INC., Taoyuan (TW)

(72) Inventors: Wei-Luen Suen, Taoyuan (TW);
Jiun-Yen Lai, Taoyuan (TW);
Hsing-Lung Shen, Hsinchu (TW);
Tsang-Yu Liu, Zhubei (TW)

(73) Assignee: Xintec Inc., Taoyuan (TW)

( * ) Notice: Subject to any disclaimer, the term of this patent is extended or adjusted under 35 U.S.C. 154(b) by 68 days.

(21) Appl. No.: 17/184,443

(22) Filed: Feb. 24, 2021

(65) Prior Publication Data
US 2021/0269303 A1  Sep. 2, 2021

Related U.S. Application Data

(60) Provisional application No. 62/984,024, filed on Mar. 2, 2020.

(51) Int. Cl.
*B81C 1/00* (2006.01)
*B81B 7/00* (2006.01)

(52) U.S. Cl.
CPC ........ *B81B 7/0067* (2013.01); *B81C 1/00317* (2013.01); *B81B 2203/0353* (2013.01); *B81C 2201/0125* (2013.01); *B81C 2201/0132* (2013.01); *B81C 2201/0194* (2013.01)

(58) Field of Classification Search
CPC ........ B81C 1/00317; B81C 2201/0125; B81C 2201/0132; B81C 2201/0194; B81C 2201/056; B81C 1/00936; B81C 1/00468–00484; B81B 2203/0353
See application file for complete search history.

(56) References Cited

U.S. PATENT DOCUMENTS

| | | | | |
|---|---|---|---|---|
| 5,719,073 | A | * 2/1998 | Shaw | .............. B81C 1/0015 216/2 |
| 2010/0273286 | A1* | 10/2010 | Liang | ............. B81C 1/00246 257/E21.211 |
| 2014/0367811 | A1* | 12/2014 | Nakagawa | ......... B81C 1/00158 257/416 |

* cited by examiner

*Primary Examiner* — Shahed Ahmed
*Assistant Examiner* — Sun Mi Kim King
(74) *Attorney, Agent, or Firm* — LIU & LIU

(57) ABSTRACT

A chip package includes a semiconductor substrate and a metal layer. The semiconductor substrate has an opening and a sidewall surrounding the opening, in which an upper portion of the sidewall is a concave surface. The semiconductor substrate is made of a material including silicon. The metal layer is located on the semiconductor substrate. The metal layer has plural through holes above the opening to define a MEMS (Microelectromechanical system) structure, in which the metal layer is made of a material including aluminum.

9 Claims, 12 Drawing Sheets

100

CHIP PACKAGE AND MANUFACTURING METHOD THEREOF

RELATED APPLICATION

This application claims priority to U.S. Provisional Application Ser. No. 62/984,024, filed Mar. 2, 2020, which is herein incorporated by reference in its entirety.

BACKGROUND

Field of Invention

The present disclosure relates to a chip package and a manufacturing method of the chip package.

Description of Related Art

In general, a chip package with a photosensitive function can be used for light tracing and detecting human eyes. The chip package may include a semiconductor substrate with an opening and a metal layer with a MEMS (Microelectromechanical system) structure. The opening of the semiconductor substrate allows light to enter such that the MEMS structure may sense the light. Before manufacturing the MEMS structure of the metal layer, if a portion of the semiconductor substrate between the aforementioned opening and the metal layer is not left remaining, the metal layer is likely to be separated from the semiconductor substrate and damage the MEMS structure. However, such a portion of the semiconductor substrate between the opening and the metal layer may obstruct the light entering the MEMS structure, thereby reducing the sensing capability of the chip package. In addition, when the metal layer forms the MEMS structure and when the semiconductor substrate is etched, a large area of the metal layer may react with oxygen, thereby producing pollutants remaining in the manufacturing equipment.

SUMMARY

An aspect of the present disclosure is related to a chip package.

According to an embodiment of the present disclosure, a chip package includes a semiconductor substrate and a metal layer. The semiconductor substrate has an opening and a sidewall surrounding the opening, in which an upper portion of the sidewall is a concave surface. The semiconductor substrate is made of a material including silicon. The metal layer is located on the semiconductor substrate. The metal layer has plural through holes above the opening to define a MEMS (Microelectromechanical system) structure, in which the metal layer is made of a material including aluminum.

In an embodiment of the present disclosure, the metal layer includes a body portion and a protruding portion. The body portion is located on the semiconductor substrate. The protruding portion is located on a side of the body portion facing away from the semiconductor substrate.

In an embodiment of the present disclosure, the protruding portion of the metal layer and the body portion of the metal layer define a staircase structure.

In an embodiment of the present disclosure, the metal layer has no interface between the body portion and the protruding portion.

In an embodiment of the present disclosure, the chip package further includes an oxide layer. The oxide layer is located on a side of the metal layer facing away from the semiconductor substrate.

In an embodiment of the present disclosure, the oxide layer and the metal layer define a staircase structure.

In an embodiment of the present disclosure, the metal layer has an interface with the oxide layer.

In an embodiment of the present disclosure, a lower portion of the sidewall of the semiconductor substrate is a vertical surface.

In an embodiment of the present disclosure, the opening of the semiconductor substrate has a first area and a second area under the first area, wherein the first area is surrounded by the concave surface, and the second area is surrounded by the vertical surface.

In an embodiment of the present disclosure, a width of the first area of the opening is bigger than a width of the second area of the opening.

An aspect of the present disclosure is related to a manufacturing method of a chip package.

According to an embodiment of the present disclosure, a manufacturing method of a chip package includes bonding a carrier onto a metal layer on a semiconductor substrate by a temporary adhesive layer, wherein the metal layer has plural oxide sections disposed therein; forming an opening in a bottom surface of the semiconductor substrate such that the semiconductor substrate has a remaining portion between the metal layer and the opening; removing the temporary adhesive layer and the carrier from the metal layer; etching the plural oxide sections such that the metal layer forms plural through holes positionally corresponding to where the plural oxide sections were disposed to define a MEMS (Microelectromechanical system) structure; and etching the semiconductor substrate to remove the remaining portion of the semiconductor substrate, wherein the semiconductor substrate has a sidewall surrounding the opening, and an upper portion of the sidewall is a concave surface.

In an embodiment of the present disclosure, the manufacturing method of the chip package further includes grinding the bottom surface of the semiconductor substrate to thin the semiconductor substrate after bonding the carrier on the metal layer.

In an embodiment of the present disclosure, wherein the opening is formed in the bottom surface of the semiconductor substrate such that a thickness of the remaining portion is in a range from 8 μm to 12 μm.

In an embodiment of the present disclosure, the manufacturing method of the chip package further includes bonding the bottom surface of the semiconductor substrate on a supporting element after forming the opening in the bottom surface of the semiconductor substrate.

In an embodiment of the present disclosure, the manufacturing method of the chip package further includes removing the supporting element from the bottom surface of the semiconductor substrate after etching the semiconductor substrate to remove the remaining portion.

In an embodiment of the present disclosure, the metal layer is made of a material including aluminum, and the plural oxide sections are etched by at least one of octafluorocyclobutane ($C_4F_8$) and carbon tetrafluoride ($CF_4$).

In an embodiment of the present disclosure, the semiconductor substrate is made of a material including silicon, and the semiconductor substrate is etched by sulfur hexafluoride ($SF_6$).

In an embodiment of the present disclosure, the manufacturing method of the chip package further includes forming a patterned photoresist on the metal layer; and removing the patterned photoresist after etching the semiconductor substrate.

In an embodiment of the present disclosure, the manufacturing method of the chip package further includes forming a patterned oxide layer on the metal layer; and leaving a portion of the patterned oxide layer remaining on the metal layer after etching the semiconductor substrate.

In the embodiments of the present disclosure, when the opening is formed in the bottom surface of the semiconductor substrate, the semiconductor substrate has the remaining portion between the metal layer and the opening. Therefore, when removing the temporary adhesive layer and the carrier from the metal layer, the metal layer can be prevented from being separated from the semiconductor substrate, and the MEMS structure can be prevented from being damaged. Furthermore, after forming the MEMS structure of the metal layer, the remaining portion of the semiconductor substrate can be removed. Therefore the light entering the MEMS structure can be increased when using the chip package, thereby promoting the sensing ability of the chip package. In addition, before forming the MEMS structure and before etching the remaining portion of the semiconductor substrate, the patterned photoresist and the oxide layer can be disposed on the metal layer such that only the metal layer above the opening reacts with oxygen, thereby drastically reducing the pollutants remaining in the manufacturing equipment.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

Figure 1:
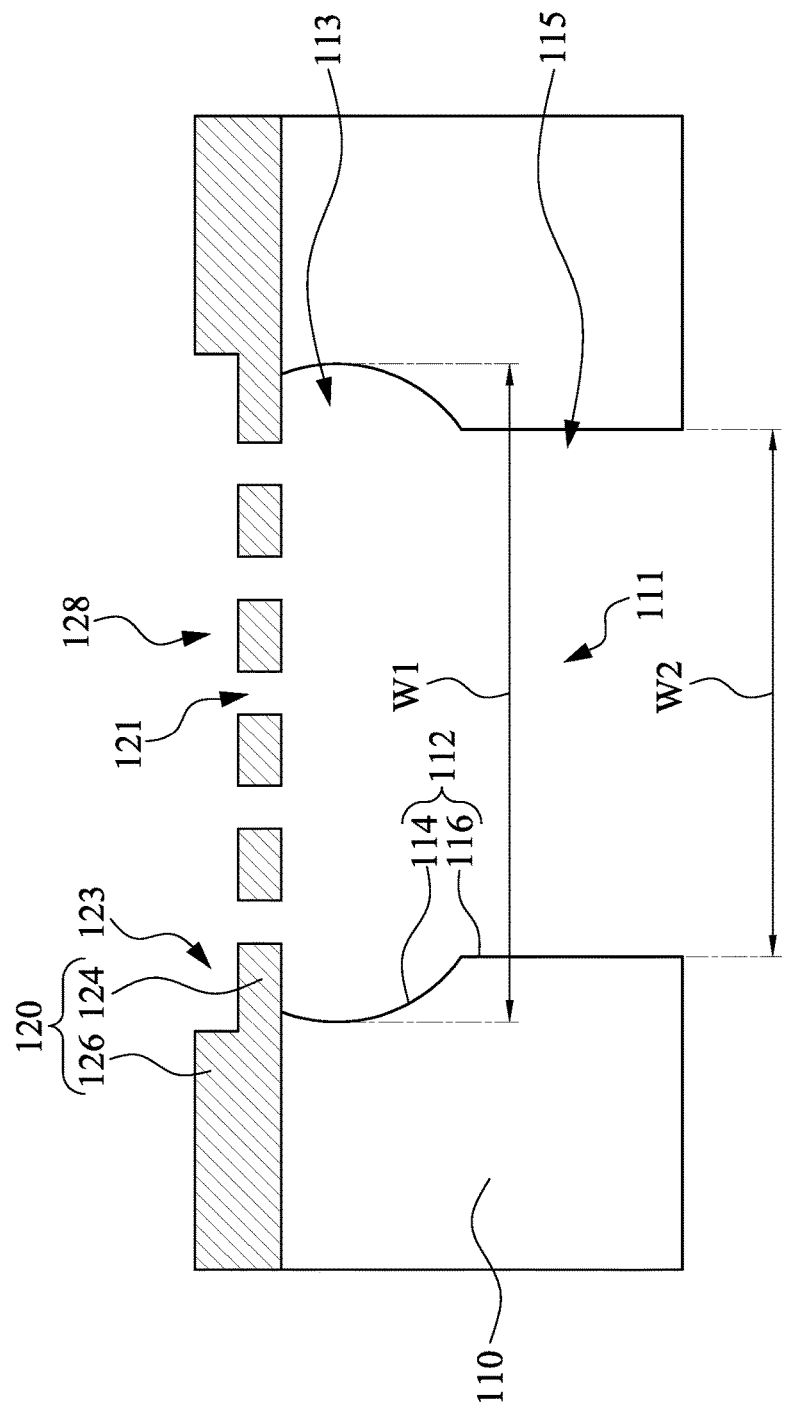
FIG. 1 illustrates a cross-sectional view of a chip package according to one embodiment of the present disclosure.

FIG. 1 illustrates a cross-sectional view of a chip package 100 according to one embodiment of the present disclosure. The chip package 100 includes a semiconductor substrate 110 and a metal layer 120. The semiconductor substrate 110 has an opening 111 and a sidewall 112 surrounding the opening 111, in which an upper portion of the sidewall 112 is a concave surface 114. The metal layer 120 is located on the semiconductor substrate 110. The metal layer 120 has plural through holes 121 above the opening 111 to define a MEMS (Microelectromechanical system) structure 128. In the embodiment, the semiconductor substrate 110 is made of a material including silicon, and the metal layer 120 is made of a material including aluminum. The chip package 100 has a photosensitive function, for example, the MEMS structure 128 can be used for light tracing and detecting human eyes, but the present disclosure is not limited to such embodiments.

In the embodiment of the present disclosure, the metal layer 120 includes a body portion 124 and a protruding portion 126. The body portion 124 is located on the semiconductor substrate 110. The protruding portion 126 is located on a side of the body portion 124 facing away from the semiconductor substrate 110. The protruding portion 126 and the body portion 124 of the metal layer 120 define a staircase structure 123. There is no interface between the body portion 124 and the protruding portion 126 of the metal layer 120. That is, the material of the protruding portion 126 is the same as the material of the body portion 124, and the protruding portion 126 and the body portion 124 are formed as a single unit.

Furthermore, a lower portion of the sidewall 112 of the semiconductor substrate 110 is a vertical surface 116. The opening 111 of the semiconductor substrate 110 has a first area 113 and a second area 115 under the first area 113, wherein the first area 113 is surrounded by the concave surface 114, and the second area 115 is surrounded by the vertical surface 116. The concave surface 114 of the sidewall 112 is recessed from the vertical surface 116, and therefore, a width W1 of the first area 113 of the opening 111 is bigger than a width W2 of the second area 115 of the opening 111.

In the following description, a method of manufacturing the chip package 100 will be described. It is to be noted that the connection relationship of the aforementioned elements will not be repeated.

Figure 2:
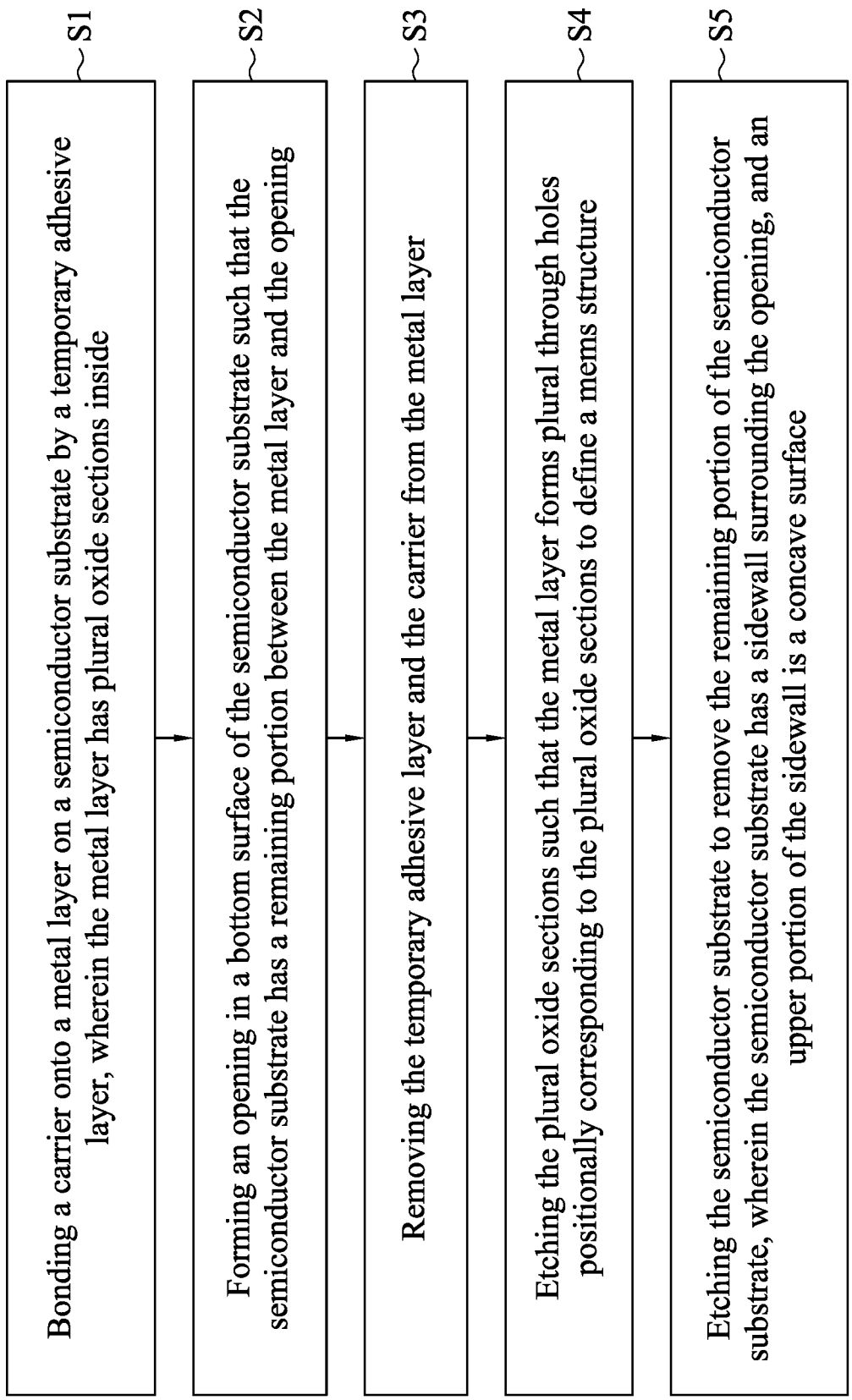
FIG. 2 illustrates a flow chart of a manufacturing method of a chip package according to one embodiment of the present disclosure.

FIG. 2 illustrates a flow chart of a manufacturing method of the chip package 100 according to one embodiment of the present disclosure. The manufacturing method of the chip package includes steps as outlined below. In step S1, a carrier is bonded onto a metal layer on a semiconductor substrate by a temporary adhesive layer, wherein the metal layer has plural oxide sections disposed therein. In step S2, an opening is formed in a bottom surface of the semiconductor substrate such that the semiconductor substrate has a remaining portion between the metal layer and the opening. In step S3, the temporary adhesive layer and the carrier are removed from the metal layer. In step S4, the plural oxide sections are etched such that the metal layer forms plural through holes positionally corresponding to where the plural oxide sections were disposed to define a MEMS (Microelectromechanical system) structure. In step S5, the semiconductor substrate is etched to remove the remaining portion of the semiconductor substrate, wherein the semiconductor substrate has a sidewall surrounding the opening, and an upper portion of the sidewall is a concave surface. In the following description, the aforementioned steps will be described in detail.

FIG. 3 to FIG. 10 illustrate cross-sectional views at various steps of a manufacturing method of the chip package 100 according to one embodiment of the present disclosure.

Figure 3:
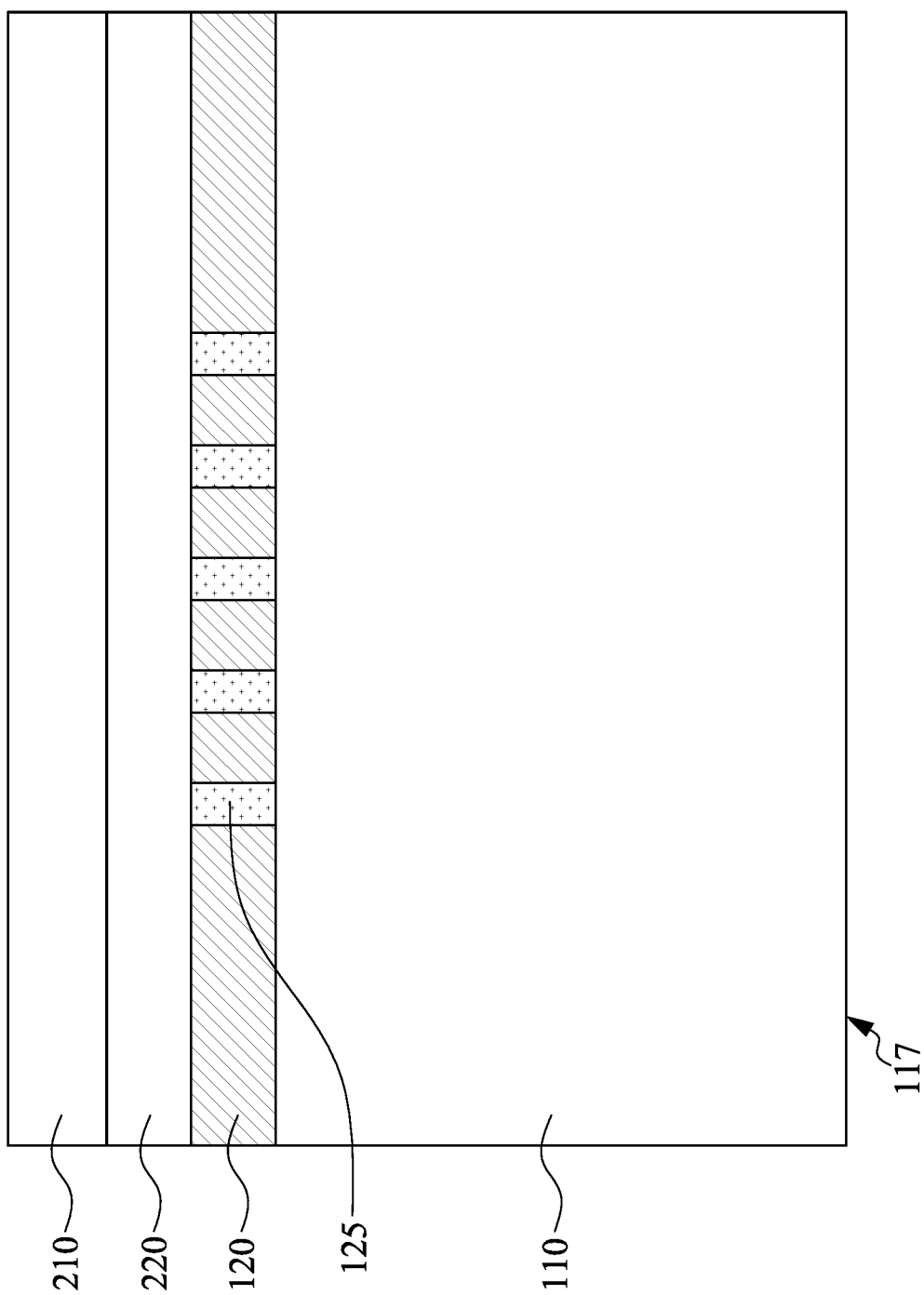
FIG. 3 to FIG. 10 illustrate cross-sectional views at various steps of a manufacturing method of a chip package according to one embodiment of the present disclosure.
Figure 4:
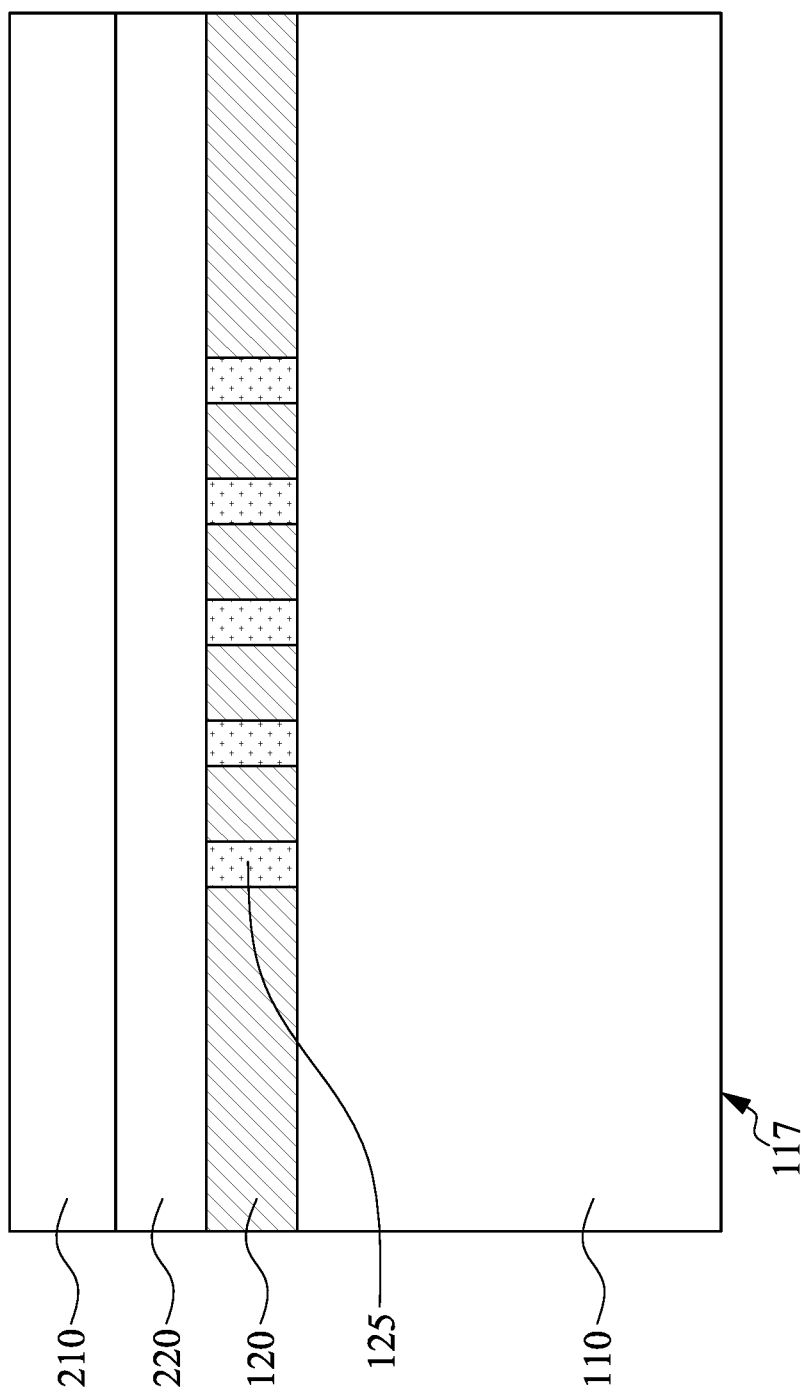

Referring to FIG. 3, a carrier 210 is bonded onto the metal layer 120 on the semiconductor substrate 110 by a temporary adhesive layer 220, wherein the metal layer 120 has plural oxide sections 125 disposed therein. In the embodiment of the present disclosure, the carrier 210 may be made of a material including glass, and the temporary adhesive layer 220 may be immersed in a specific liquid or irradiated with light of a specific wavelength to make its adhesion disappear. Referring to FIG. 4, a bottom surface 117 of the semiconductor substrate 110 is ground to thin the semiconductor substrate 110 after bonding the carrier 210 on the metal layer 120.

Figure 5:
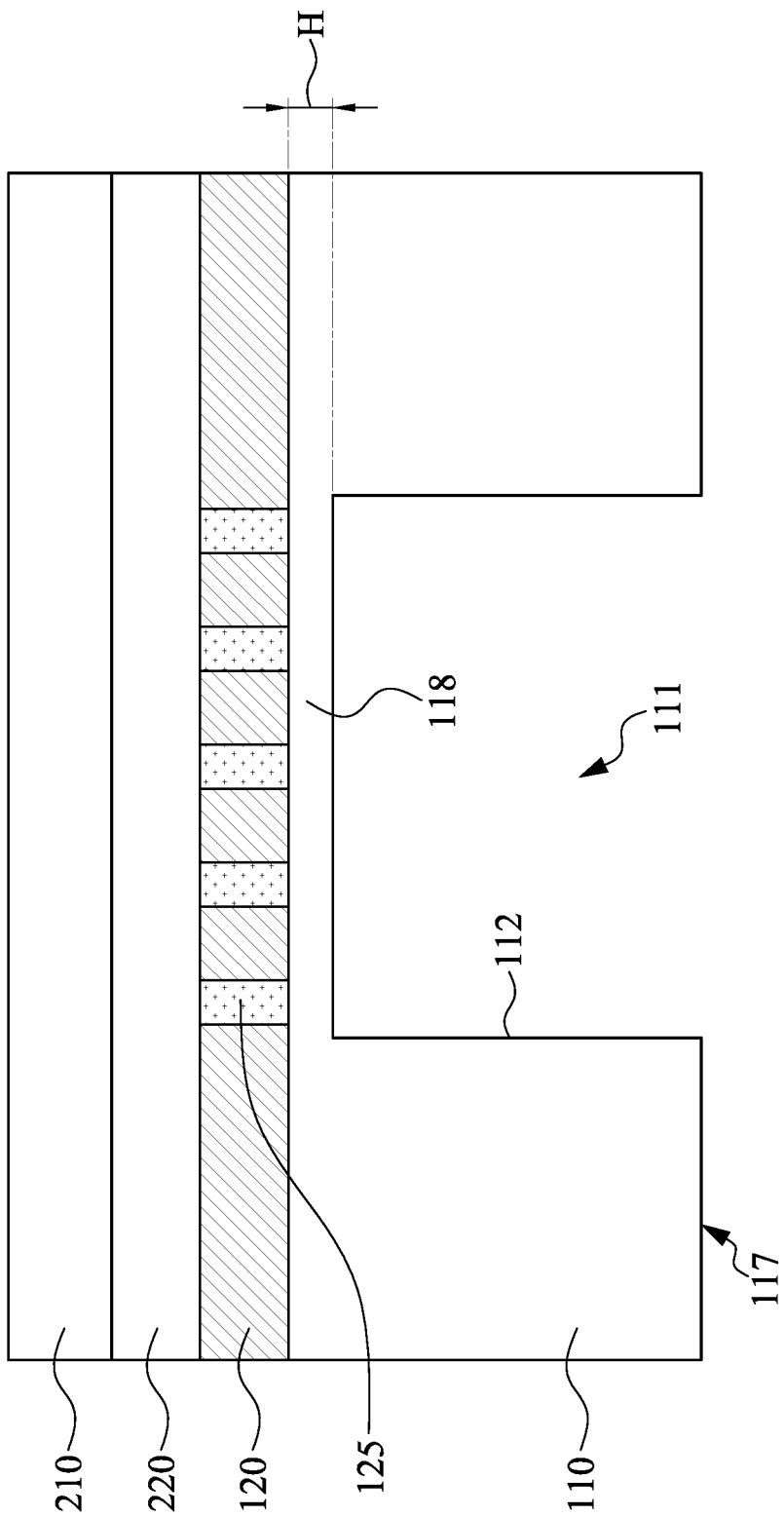
Figure 6:
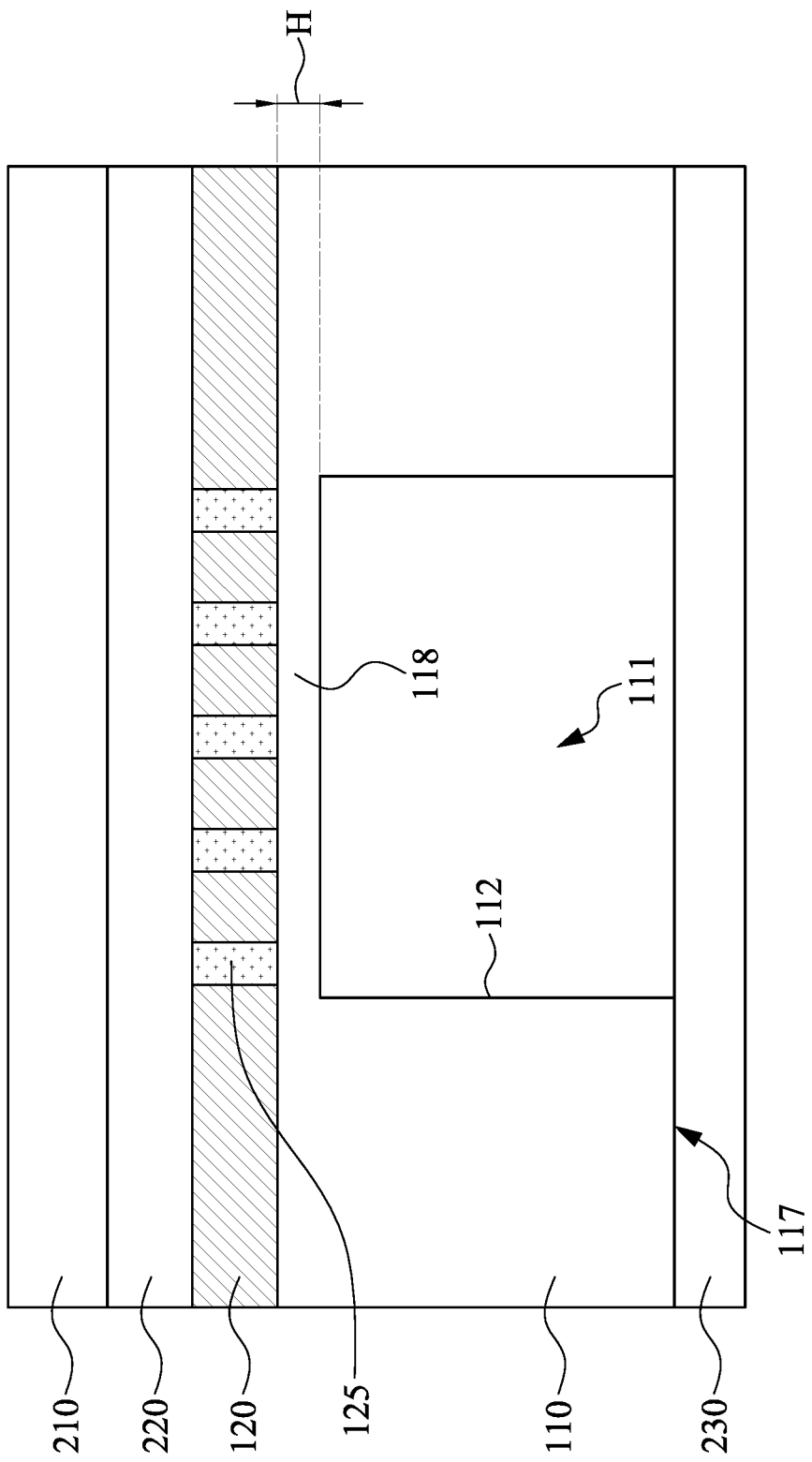

Referring to FIG. 5, next, the opening 111 is formed in the bottom surface 117 of the semiconductor substrate 110 such that the semiconductor substrate 110 has a remaining portion 118 between the metal layer 120 and the opening 111. The remaining portion 118 is located substantially corresponding to positions of the oxide sections 125. In the embodiment of the present disclosure, after the opening 111 is formed in the bottom surface 117 of the semiconductor substrate 110, a thickness H of the remaining portion 118 is in a range from 8 µm to 12 µm. Referring to FIG. 6, after the opening 111 is formed in the bottom surface 117 of the semiconductor substrate 110, the bottom surface 117 of the semiconductor substrate 110 is bonded on a supporting element 230. In the embodiment of the present disclosure, the supporting element 230 may be a thermal tape.

Figure 7:
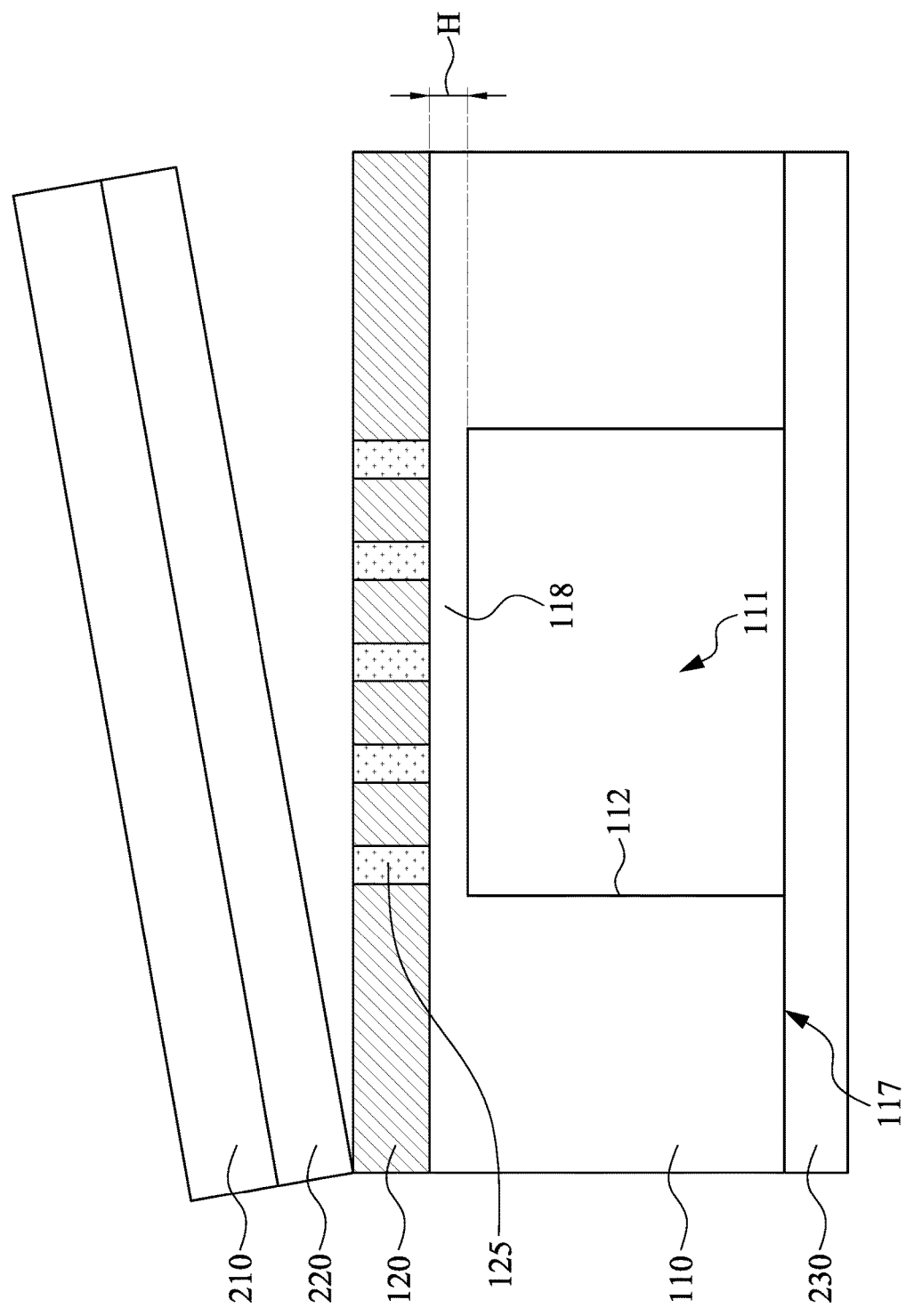
Figure 8:
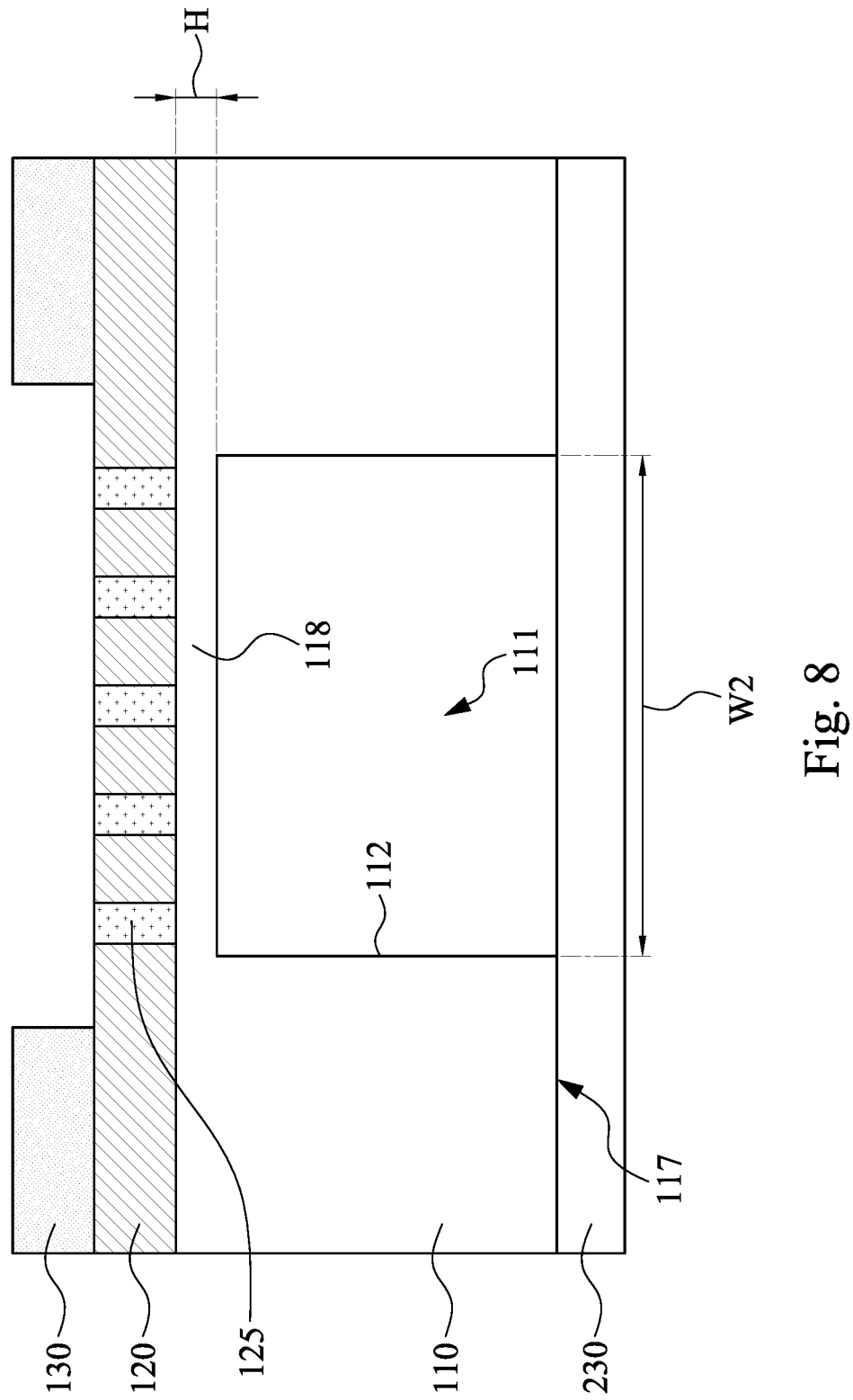

Referring to FIG. 7, next, the temporary adhesive layer 220 and the carrier 210 are removed from the metal layer 120. Since the semiconductor substrate 110 has the remaining portion 118 between the metal layer 120 and the opening 111 after the opening 111 is formed in the bottom surface 117 of the semiconductor substrate 110, when removing the temporary adhesive layer 220 and the carrier 210 from the metal layer 120, the metal layer 120 can be prevented from being separated from the semiconductor substrate 110, and an area where the MEMS structure 128 (see FIG. 9) is subsequently formed can be prevented from being damaged. Referring to FIG. 8, after removing the temporary adhesive layer 220 and the carrier 210, a patterned photoresist 130 is formed on the metal layer 120. The patterned photoresist 130 surrounds a portion of the metal layer 120 and the oxide sections 125 above the opening 111.

Figure 9:
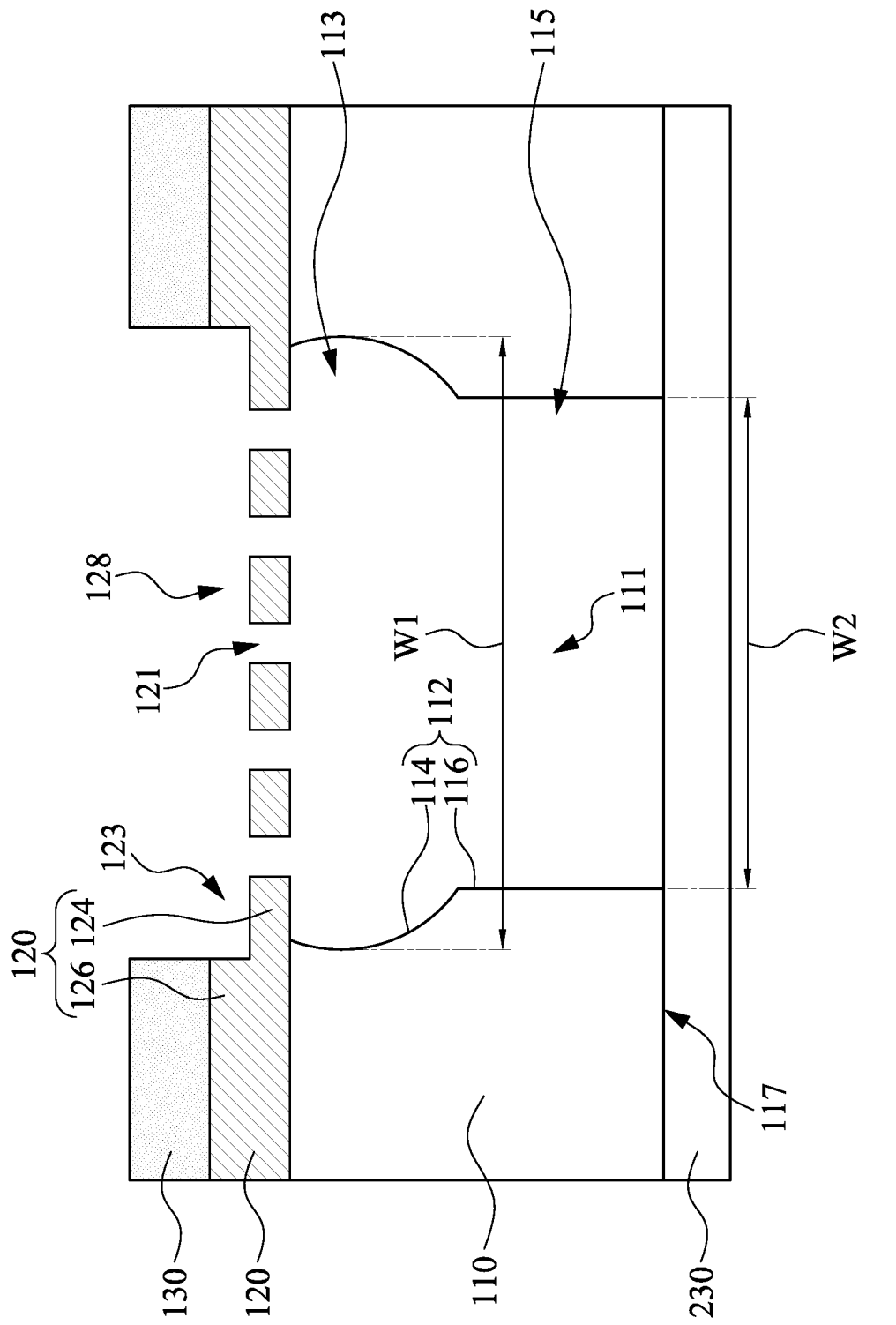

Referring to both FIG. 8 and FIG. 9, next, the patterned photoresist 130 serves as a mask for etching the oxide sections 125. After the oxide sections 125 are removed, the metal layer 120 forms plural through holes 121 positionally corresponding to where the oxide sections 125 were disposed to define the MEMS structure 128. In the embodiment of the present disclosure, the metal layer 120 may be made of a material including aluminum, and the oxide sections 125 are etched by at least one of octafluorocyclobutane ($C_4F_8$) and carbon tetrafluoride ($CF_4$). After forming the MEMS structure 128, the through holes 121 may transport gas to etch the semiconductor substrate 110 to remove the remaining portion 118 of the semiconductor substrate 110 under the MEMS structure 128. In the embodiment of the present disclosure, the semiconductor substrate 110 may be made of a material including silicon, and the semiconductor substrate 110 is etched by sulfur hexafluoride ($SF_6$). Since the etching gas also etches the sidewall 112 of the semiconductor substrate 110 surrounding the opening 111, the upper portion of the sidewall 112 is formed into the concave surface 114. Since the remaining portion 118 of the semiconductor substrate 110 is removed, the light which enters the MEMS structure 128 can be increased when using the chip package 100 (see FIG. 1), thereby promoting the sensing capability of the chip package 100.

Furthermore, when the oxide sections 125 and the remaining portion 118 of the semiconductor substrate 110 are etched, oxygen is supplied, and this oxygen reacts with the metal layer 120 such that oxide is created. For example, if the material of the metal layer 120 is aluminum, aluminum oxide is created, and the aluminum oxide may be viewed as a pollutant. In the embodiment of the present disclosure, before forming the MEMS structure 128 and before etching the remaining portion 118 of the semiconductor substrate 110 (see FIG. 8), the patterned photoresist 130 is disposed on the metal layer 120 such that only the metal layer 120 above the opening 111 reacts with the oxygen, thereby drastically reducing the pollutants remaining in the manufacturing equipment. Since the metal layer 120 not covered by the patterned photoresist 130 reacts with the oxygen and is depleted, the thickness of the portion of the metal layer 120 that is not covered is thinner than the thickness of the portion of the metal layer 120 that is covered such that the semiconductors substrate 110 forms the protruding portion 126 and the staircase structure 123.

Figure 10:
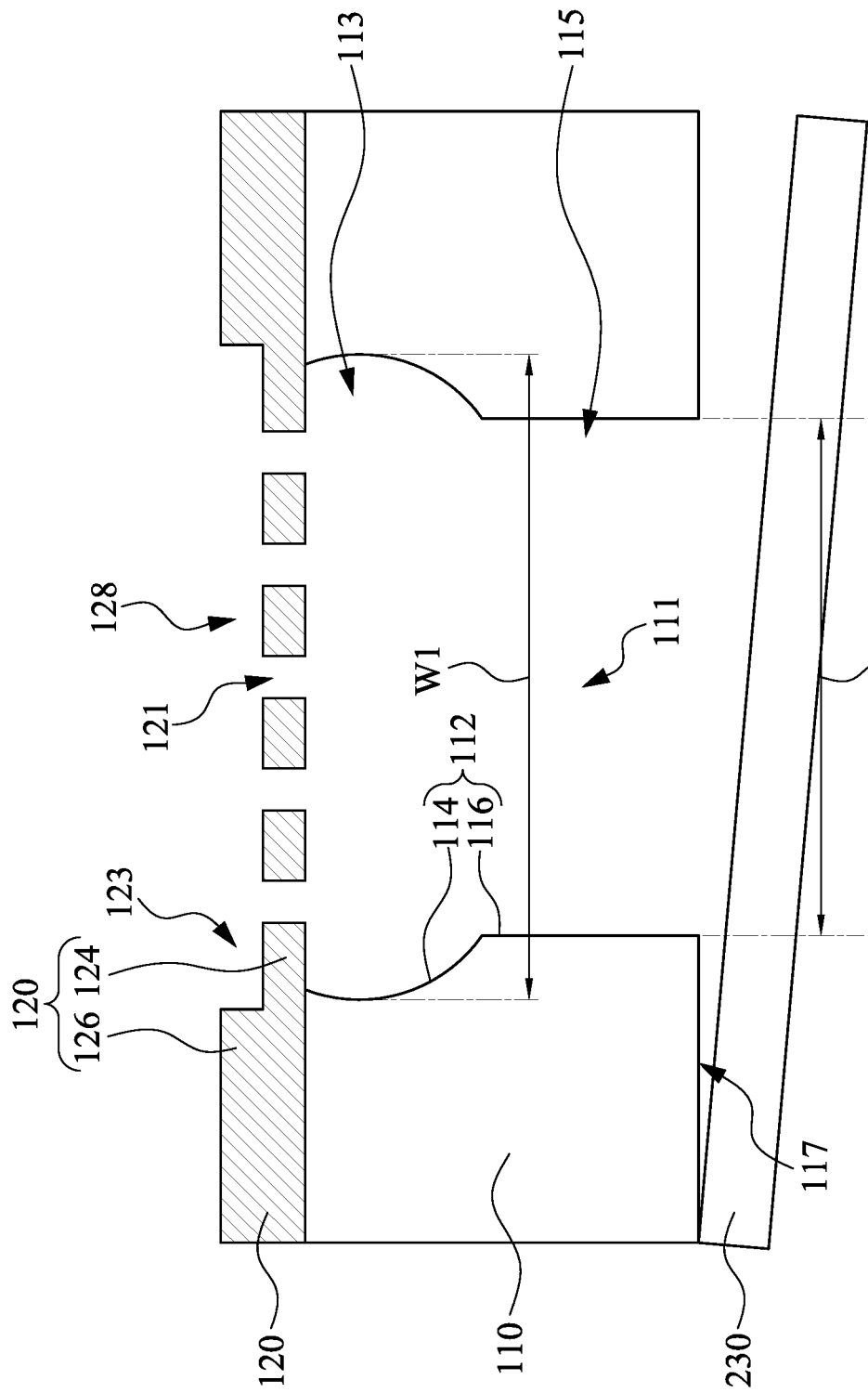

Referring to both FIG. 9 and FIG. 10, after etching the semiconductor substrate 110, the patterned photoresist 130 may be removed to expose the staircases structure 123. Moreover, after the patterned photoresist 130 is removed, the supporting element 230 may be removed from the bottom surface 117 of the semiconductor substrate 110. The semiconductor substrate 110 shown in FIG. 3 to FIG. 10 may be a wafer, and a subsequent dicing process may be performed to form a chip, such as the semiconductor substrate 110 of the chip package 100 shown in FIG. 1.

Figure 11:
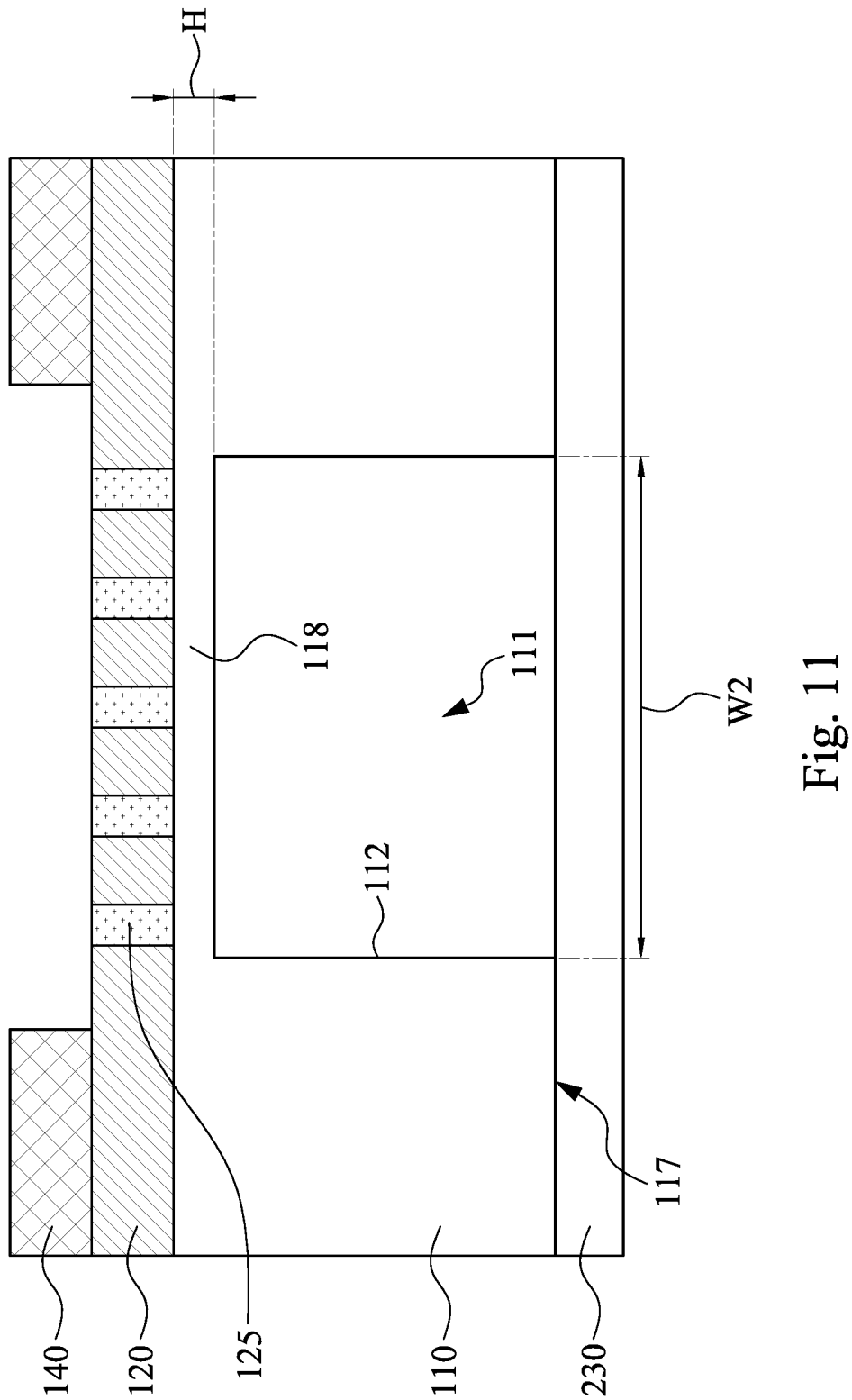
FIG. 11 illustrates a cross-sectional view at the step in FIG. 8 of a manufacturing method of a chip package according to another embodiment of the present disclosure.

FIG. 11 illustrates a cross-sectional view at the step in FIG. 8 of a manufacturing method of a chip package 100a (see FIG. 12) according to another embodiment of the present disclosure. The difference from the embodiment shown in FIG. 8 is that a patterned oxide layer 140 is formed on the metal layer 120 to replace the patterned photoresist 130 shown in FIG. 8.

Figure 12:
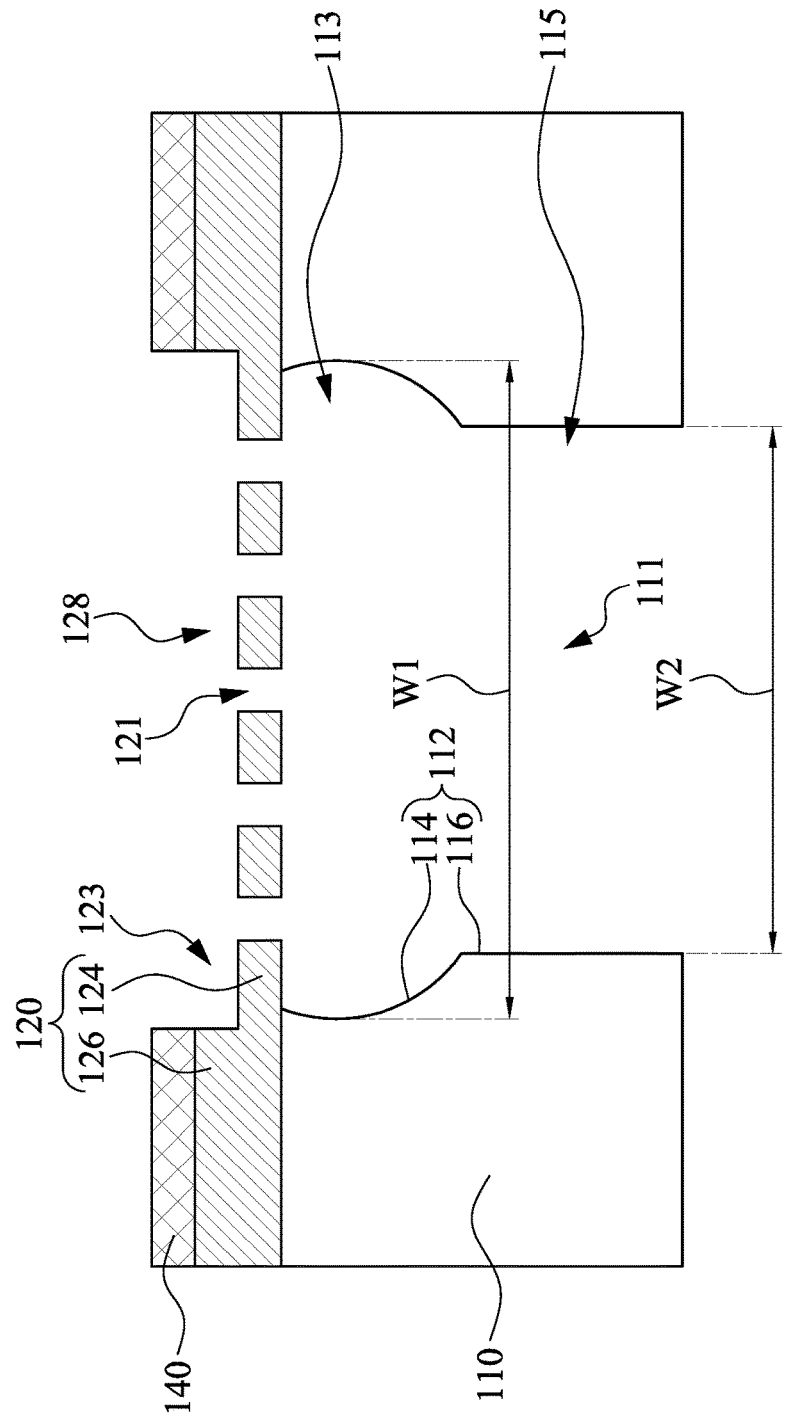
FIG. 12 illustrates a cross-sectional view of a chip package according to another embodiment of the present disclosure.

FIG. 12 illustrates a cross-sectional view of the chip package 100a according to another embodiment of the present disclosure. After forming the structure shown in FIG. 11, the oxide sections 125 and the remaining portion 118 of the semiconductor substrate 110 may be sequentially etched. In the aforementioned two steps, oxygen is supplied and reacts with the metal layer 120 and the oxide layer 140, so that the metal layer 120 and the oxide layer 140 become thinner. That is, after etching the semiconductor substrate 110, a portion of the oxide layer 140 remains on the metal layer 120. The difference from the embodiment shown in FIG. 1 is that the chip package 100a includes the oxide layer 140. The oxide layer 140 is located on a side of the metal layer 120 facing away from the semiconductor substrate 110. The oxide layer 140 and the metal layer 120 define the staircase structure 123. The material of the metal layer 120 is different from the material of the oxide layer 140, so that there is an interface between the metal layer 120 and the oxide layer 140. In the embodiment of the present disclosure, disposing the patterned oxide layer 140 on the metal layer 120 can drastically reduce the pollutants remaining in the manufacturing equipment.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure covers modifications and variations of this disclosure provided they fall within the scope of the following claims.

What is claimed is:

1. A manufacturing method of a chip package, comprising:

bonding a carrier onto a metal layer that is on a top surface of a semiconductor substrate by a temporary adhesive layer, wherein the metal layer has plural oxide sections disposed therein;

forming an opening in a bottom surface of the semiconductor substrate such that the semiconductor substrate has a remaining portion between the metal layer and the opening, wherein the semiconductor substrate has a sidewall surrounding the opening;

after forming the opening in the bottom surface of the semiconductor substrate, removing the temporary adhesive layer and the carrier from the metal layer;

after removing the temporary adhesive layer and the carrier from the metal layer, etching the plural oxide sections such that the metal layer forms plural through holes positionally corresponding to where the plural oxide sections were disposed to define a MEMS (Microelectromechanical system) structure; and after etching the plural oxide sections, etching the semiconductor substrate to remove the remaining portion of the semiconductor substrate and a portion of the sidewall of the semiconductor substrate, such that an upper portion of the sidewall is a concave surface that faces toward and surrounds the opening, and a lower portion of the sidewall of the semiconductor substrate is a vertical surface that faces toward and surrounds the opening, wherein the semiconductor substrate has no portion in the opening and overlapped with the MEMS structure in a vertical direction.

2. The manufacturing method of the chip package of claim 1, further comprising:

grinding the bottom surface of the semiconductor substrate to thin the semiconductor substrate after bonding the carrier on the metal layer.

3. The manufacturing method of the chip package of claim 1, wherein the opening is formed in the bottom surface of the semiconductor substrate such that a thickness of the remaining portion is in a range from 8 µm to 12 µm.

4. The manufacturing method of the chip package of claim 1, further comprising:

bonding the bottom surface of the semiconductor substrate on a supporting element after forming the opening in the bottom surface of the semiconductor substrate.

5. The manufacturing method of the chip package of claim 4, further comprising:

removing the supporting element from the bottom surface of the semiconductor substrate after etching the semiconductor substrate to remove the remaining portion.

6. The manufacturing method of the chip package of claim 1, wherein the metal layer is made of a material comprising aluminum, and the plural oxide sections are etched by at least one of octafluorocyclobutane ($C_4F_8$) and carbon tetrafluoride ($CF_4$).

7. The manufacturing method of the chip package of claim 1, wherein the semiconductor substrate is made of a material comprising silicon, and the semiconductor substrate is etched by sulfur hexafluoride ($SF_6$).

8. The manufacturing method of the chip package of claim 1, further comprising:

forming a patterned photoresist on the metal layer; and removing the patterned photoresist after etching the semiconductor substrate.

9. The manufacturing method of the chip package of claim 1, further comprising:

forming a patterned oxide layer on the metal layer; and leaving a portion of the patterned oxide layer remaining on the metal layer after etching the semiconductor substrate.

* * * * *